United States Patent
Chu-Kung et al.

(10) Patent No.: US 10,727,339 B2
(45) Date of Patent: Jul. 28, 2020

(54) SELECTIVELY REGROWN TOP CONTACT FOR VERTICAL SEMICONDUCTOR DEVICES

(71) Applicant: Intel Corporation, Santa Clara, CA (US)

(72) Inventors: Benjamin Chu-Kung, Portland, OR (US); Gilbert Dewey, Hillsboro, OR (US); Van H. Le, Portland, OR (US); Jack T. Kavalieros, Portland, OR (US); Marko Radosavljevic, Beaverton, OR (US); Ravi Pillarisetty, Portland, OR (US); Han Wui Then, Portland, OR (US); Niloy Mukherjee, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/119,674

(22) PCT Filed: Mar. 28, 2014

(86) PCT No.: PCT/US2014/032204
§ 371 (c)(1),
(2) Date: Aug. 17, 2016

(87) PCT Pub. No.: WO2015/147866
PCT Pub. Date: Oct. 1, 2015

(65) Prior Publication Data
US 2017/0012126 A1   Jan. 12, 2017

(51) Int. Cl.
*H01L 29/06*   (2006.01)
*H01L 29/417*   (2006.01)
(Continued)

(52) U.S. Cl.
CPC ...... *H01L 29/7848* (2013.01); *H01L 29/0676* (2013.01); *H01L 29/0847* (2013.01);
(Continued)

(58) Field of Classification Search
CPC .......... H01L 29/1037; H01L 29/66666; H01L 29/66712; H01L 29/7827; H01L 29/78642;
(Continued)

(56) References Cited

U.S. PATENT DOCUMENTS 4,554,570 A * 11/1985 Jastrzebski ............. H01L 21/28
257/331
5,311,050 A * 5/1994 Nitayama ............. H01L 27/092
257/330
(Continued)

FOREIGN PATENT DOCUMENTS

KR   20090007393   1/2009
TW   201208076   2/2012
(Continued)

OTHER PUBLICATIONS

International Search Report and Written Opinion for PCT Patent Application No. PCT/US2014/032204 dated Dec. 23, 2014, 13 pgs.
(Continued)

*Primary Examiner* — Mary A Wilczewski
(74) *Attorney, Agent, or Firm* — Schwabe, Williamson & Wyatt, P.C.

(57) ABSTRACT

Vertical semiconductor devices having selectively regrown top contacts and method of fabricating vertical semiconductor devices having selectively regrown top contacts are described. For example, a semiconductor device includes a substrate having a surface. A first source/drain region is disposed on the surface of the substrate. A vertical channel region is disposed on the first source/drain region and has a
(Continued)

first width parallel with the surface of the substrate. A second source/drain region is disposed on the vertical channel region and has a second width parallel with and substantially greater than the first width. A gate stack is disposed on and completely surrounds a portion of the vertical channel region.

23 Claims, 7 Drawing Sheets

(51) Int. Cl.
  *H01L 29/423* (2006.01)
  *H01L 29/78* (2006.01)
  *H01L 29/786* (2006.01)
  *H01L 21/336* (2006.01)
  *H01L 29/66* (2006.01)
  *H01L 29/08* (2006.01)
  *H01L 29/739* (2006.01)

(52) U.S. Cl.
  CPC .. *H01L 29/41741* (2013.01); *H01L 29/42392* (2013.01); *H01L 29/66356* (2013.01); *H01L 29/66666* (2013.01); *H01L 29/66742* (2013.01); *H01L 29/66977* (2013.01); *H01L 29/7391* (2013.01); *H01L 29/7827* (2013.01); *H01L 29/78618* (2013.01); *H01L 29/78642* (2013.01); *H01L 29/78681* (2013.01); *H01L 29/78684* (2013.01); *H01L 29/78696* (2013.01)

(58) Field of Classification Search
  CPC ........... H01L 29/78696; H01L 29/0676; H01L 29/1041; H01L 29/105; H01L 21/823412; H01L 21/823418; H01L 21/823487; H01L 21/823807; H01L 21/823814; H01L 21/823885; H01L 29/42392; H01L 29/0847; H01L 29/41741; H01L 29/66356; H01L 29/66742; H01L 29/66977; H01L 29/7391; H01L 29/7848; H01L 29/78618; H01L 29/78681; H01L 29/78684

See application file for complete search history.

(56) References Cited

U.S. PATENT DOCUMENTS

| | | | | |
|---|---|---|---|---|
| 5,324,673 | A * | 6/1994 | Fitch | H01L 21/28525 257/329 |
| 5,612,563 | A * | 3/1997 | Fitch | H01L 21/76897 257/329 |
| 5,960,282 | A * | 9/1999 | Chuang | H01L 27/10808 257/E21.655 |
| 6,027,975 | A | 2/2000 | Hergenrother | |
| 6,060,746 | A * | 5/2000 | Bertin | H01L 29/66666 257/331 |
| 6,337,497 | B1 * | 1/2002 | Hanafi | H01L 27/10808 257/306 |
| 6,660,590 | B2 * | 12/2003 | Yoo | H01L 29/66666 257/E21.41 |
| 6,873,009 | B2 * | 3/2005 | Hisamoto | G11C 11/404 257/316 |
| 7,528,424 | B2 * | 5/2009 | Ramaswamy | H01L 21/0237 257/183 |
| 7,670,911 | B2 * | 3/2010 | Oyu | H01L 29/0653 257/E21.375 |
| 7,709,326 | B2 * | 5/2010 | Ramaswamy | H01L 29/66787 257/E21.132 |
| 7,807,535 | B2 * | 10/2010 | Ramaswamy | H01L 29/66787 257/E21.131 |
| 7,977,736 | B2 * | 7/2011 | Kim | H01L 21/823842 257/328 |
| 8,049,203 | B2 * | 11/2011 | Samuelson | B82Y 10/00 257/13 |
| 8,207,566 | B2 * | 6/2012 | Lee | H01L 29/66666 257/302 |
| 8,241,983 | B2 * | 8/2012 | Iacopi | H01L 29/7391 257/192 |
| 8,497,548 | B2 * | 7/2013 | Masuoka | H01L 21/823885 257/329 |
| 8,531,010 | B2 * | 9/2013 | Oyu | H01L 21/823412 257/329 |
| 8,673,706 | B2 * | 3/2014 | Ramaswamy | H01L 29/66787 257/E21.131 |
| 8,896,056 | B2 * | 11/2014 | Masuoka | H01L 29/42356 257/329 |
| 9,214,556 | B2 * | 12/2015 | Wann | H01L 29/785 |
| 9,299,835 | B1 * | 3/2016 | Anderson | H01L 29/7827 |
| 9,312,383 | B1 * | 4/2016 | Cheng | H01L 29/7827 |
| 9,368,572 | B1 * | 6/2016 | Cheng | H01L 29/7827 |
| 9,368,619 | B2 * | 6/2016 | Colinge | H01L 29/7827 |
| 9,431,305 | B1 * | 8/2016 | Anderson | H01L 21/823885 |
| 9,443,982 | B1 * | 9/2016 | Balakrishnan | H01L 29/66742 |
| 9,450,047 | B1 * | 9/2016 | Liao | H01L 29/0847 |
| 9,466,668 | B2 * | 10/2016 | Colinge | H01L 29/0676 |
| 9,515,187 | B2 * | 12/2016 | Kwok | H01L 29/045 |
| 9,530,661 | B2 * | 12/2016 | Kim | H01L 21/0262 |
| 9,564,493 | B2 * | 2/2017 | Colinge | H01L 29/267 |
| 9,570,356 | B1 * | 2/2017 | Balakrishnan | H01L 21/823487 |
| 9,579,356 | B2 * | 2/2017 | Hastings | A61K 31/045 |
| 9,607,899 | B1 * | 3/2017 | Cheng | H01L 21/823475 |
| 9,614,087 | B1 * | 4/2017 | Cheng | H01L 29/7827 |
| 9,627,511 | B1 * | 4/2017 | Cheng | H01L 29/66553 |
| 9,640,667 | B1 * | 5/2017 | Balakrishnan | H01L 29/42392 |
| 9,647,112 | B1 * | 5/2017 | Balakrishnan | H01L 29/7845 |
| 9,653,465 | B1 * | 5/2017 | Balakrishnan | H01L 27/088 |
| 9,685,409 | B1 * | 6/2017 | Balakrishnan | H01L 29/66666 |
| 9,704,990 | B1 * | 7/2017 | Mochizuki | H01L 21/823431 |
| 9,704,991 | B1 * | 7/2017 | Cheng | H01L 29/7827 |
| 9,711,618 | B1 * | 7/2017 | Cheng | H01L 29/66545 |
| 9,716,170 | B1 * | 7/2017 | Cheng | H01L 29/7827 |
| 9,728,466 | B1 * | 8/2017 | Mallela | H01L 21/823814 |
| 9,728,542 | B1 * | 8/2017 | Balakrishnan | H01L 27/11206 |
| 9,728,635 | B1 * | 8/2017 | Cheng | H01L 29/7827 |
| 9,735,246 | B1 * | 8/2017 | Basker | H01L 29/42392 |
| 9,735,253 | B1 * | 8/2017 | Bi | H01L 29/66666 |
| 9,741,626 | B1 * | 8/2017 | Cheng | H01L 29/4236 |
| 9,748,359 | B1 * | 8/2017 | Gluschenkov | H01L 21/2236 |
| 9,748,380 | B1 * | 8/2017 | Lie | H01L 29/7827 |
| 9,748,382 | B1 * | 8/2017 | Gluschenkov | H01L 29/7827 |
| 9,755,071 | B1 * | 9/2017 | Anderson | H01L 29/7827 |
| 9,755,073 | B1 * | 9/2017 | Cheng | H01L 29/7843 |
| 9,761,712 | B1 * | 9/2017 | Anderson | H01L 29/7827 |
| 9,761,726 | B1 * | 9/2017 | Balakrishnan | H01L 29/78642 |
| 9,768,166 | B1 * | 9/2017 | Cheng | H01L 27/088 |
| 9,773,901 | B1 * | 9/2017 | Gluschenkov | H01L 29/7827 |
| 9,773,913 | B1 * | 9/2017 | Balakrishnan | H01L 29/78618 |
| 9,780,088 | B1 * | 10/2017 | Balakrishnan | H01L 27/0629 |
| 9,780,100 | B1 * | 10/2017 | Balakrishnan | H01L 29/66545 |
| 9,780,194 | B1 * | 10/2017 | Balakrishnan | H01L 29/7827 |
| 9,786,758 | B1 * | 10/2017 | Balakrishnan | H01L 29/42392 |
| 9,786,760 | B1 * | 10/2017 | Bonilla | H01L 29/4991 |
| 9,799,570 | B1 * | 10/2017 | Cheng | H01L 21/823878 |
| 9,799,647 | B1 * | 10/2017 | Cheng | H01L 27/0629 |
| 9,799,655 | B1 * | 10/2017 | Cheng | H01L 27/0924 |
| 9,837,405 | B1 * | 12/2017 | Cheng | H01L 27/0886 |
| 9,859,166 | B1 * | 1/2018 | Cheng | H01L 21/823487 |
| 9,859,172 | B1 * | 1/2018 | Anderson | H01L 21/8249 |
| 9,859,301 | B1 * | 1/2018 | Balakrishnan | H01L 27/1207 |
| 9,859,420 | B1 * | 1/2018 | Balakrishnan | H01L 29/7827 |
| 9,865,730 | B1 * | 1/2018 | Jagannathan | H01L 29/7827 |
| 9,870,952 | B1 * | 1/2018 | Cheng | H01L 21/823487 |
| 9,876,015 | B1 * | 1/2018 | Balakrishnan | H01L 27/092 |
| 9,893,207 | B1 * | 2/2018 | Balakrishnan | H01L 29/7889 |
| 9,899,373 | B1 * | 2/2018 | Cheng | H01L 27/0629 |
| 9,899,515 | B1 * | 2/2018 | Cheng | H01L 29/7827 |
| 9,929,246 | B1 * | 3/2018 | Cheng | H01L 29/4991 |

(56) References Cited

U.S. PATENT DOCUMENTS

| | | | |
|---|---|---|---|
| 9,934,977 B1* | 4/2018 | Adusumilli | H01L 21/28518 |
| 9,935,102 B1* | 4/2018 | Bi | H01L 27/0886 |
| 9,935,195 B1* | 4/2018 | Xu | H01L 29/7827 |
| 9,947,649 B1* | 4/2018 | Balakrishnan | H01L 27/0255 |
| 9,953,973 B1* | 4/2018 | Balakrishnan | H01L 29/66136 |
| 9,954,102 B1* | 4/2018 | Mochizuki | H01L 29/6653 |
| 9,960,254 B1* | 5/2018 | Bao | H01L 29/66666 |
| 9,960,272 B1* | 5/2018 | Bao | H01L 29/7827 |
| 9,991,267 B1* | 6/2018 | Anderson | H01L 27/10832 |
| 9,991,359 B1* | 6/2018 | Balakrishnan | H01L 29/66356 |
| 9,991,365 B1* | 6/2018 | Cheng | H01L 29/66666 |
| 10,020,381 B1* | 7/2018 | Fan | H01L 29/66666 |
| 10,056,379 B1* | 8/2018 | Balakrishnan | H01L 27/0922 |
| 10,096,709 B2* | 10/2018 | Le | H01L 29/7391 |
| 2003/0122187 A1 | 7/2003 | Yoo | |
| 2004/0157353 A1* | 8/2004 | Ouyang | H01L 29/1054 438/38 |
| 2004/0256639 A1* | 12/2004 | Ouyang | H01L 21/823807 257/202 |
| 2004/0262681 A1* | 12/2004 | Masuoka | H01L 29/42384 257/335 |
| 2006/0022253 A1* | 2/2006 | Anderson | H01L 21/84 257/315 |
| 2006/0113524 A1 | 6/2006 | Bill et al. | |
| 2006/0278921 A1 | 12/2006 | Pellizzer et al. | |
| 2007/0045721 A1 | 3/2007 | Forbes | |
| 2007/0148939 A1* | 6/2007 | Chu | H01L 21/823807 438/590 |
| 2008/0237637 A1* | 10/2008 | Ouyang | H01L 29/778 257/190 |
| 2009/0200605 A1 | 8/2009 | Bjoerk et al. | |
| 2010/0078698 A1* | 4/2010 | Son | B82Y 10/00 257/296 |
| 2010/0181614 A1* | 7/2010 | Nojima | H01L 29/66666 257/329 |
| 2010/0207201 A1* | 8/2010 | Masuoka | H01L 27/0207 257/329 |
| 2010/0213539 A1* | 8/2010 | Masuoka | H01L 21/84 257/329 |
| 2010/0252862 A1 | 10/2010 | Ko et al. | |
| 2010/0270611 A1* | 10/2010 | Masuoka | H01L 21/823885 257/329 |
| 2010/0314671 A1* | 12/2010 | Oyu | H01L 27/0207 257/255 |
| 2012/0025286 A1* | 2/2012 | Nojima | H01L 27/10823 257/296 |
| 2012/0088343 A1 | 4/2012 | Son et al. | |
| 2012/0138886 A1 | 6/2012 | Kuhn et al. | |
| 2013/0075797 A1* | 3/2013 | Okano | H01L 29/66795 257/288 |
| 2014/0084342 A1 | 3/2014 | Cappellani et al. | |
| 2014/0120678 A1* | 5/2014 | Shinriki | H01L 29/66795 438/283 |
| 2015/0035017 A1* | 2/2015 | Wann | H01L 29/785 257/288 |
| 2015/0048293 A1* | 2/2015 | Park | H01L 27/2436 257/2 |
| 2015/0137183 A1* | 5/2015 | Kwok | H01L 29/045 257/192 |
| 2016/0035886 A1* | 2/2016 | Chen | H01L 21/324 257/329 |
| 2016/0042963 A1* | 2/2016 | Kim | H01L 21/0262 438/507 |
| 2016/0111542 A1* | 4/2016 | Zhang | H01L 29/7851 257/401 |
| 2016/0149036 A1* | 5/2016 | Huang | H01L 29/7848 257/401 |
| 2016/0190312 A1* | 6/2016 | Zhang | H01L 29/7827 257/192 |
| 2016/0365448 A1* | 12/2016 | Liao | H01L 29/0847 |
| 2017/0012126 A1* | 1/2017 | Chu-Kung | H01L 29/41741 |
| 2017/0194155 A1* | 7/2017 | Anderson | H01L 21/28518 |
| 2017/0200825 A1* | 7/2017 | Hung | H01L 21/02532 |
| 2017/0213836 A1* | 7/2017 | Zhang | H01L 27/10879 |
| 2017/0229558 A1* | 8/2017 | Anderson | H01L 29/66795 |
| 2017/0301590 A1* | 10/2017 | Anderson | H01L 27/0617 |
| 2017/0338334 A1* | 11/2017 | Cheng | H01L 29/7827 |
| 2017/0358497 A1* | 12/2017 | Cheng | H01L 21/823418 |
| 2017/0358607 A1* | 12/2017 | Balakrishnan | H01L 27/1207 |
| 2017/0365673 A1* | 12/2017 | Cheng | H01L 29/785 |
| 2017/0365712 A1* | 12/2017 | Bu | H01L 29/7827 |
| 2017/0373159 A1* | 12/2017 | Cheng | H01L 29/41791 |
| 2017/0373167 A1* | 12/2017 | Bergendahl | H01L 29/785 |
| 2018/0004791 A1* | 1/2018 | Lie | G06F 11/1469 |
| 2018/0005896 A1* | 1/2018 | Mallela | H01L 21/823456 |
| 2018/0005904 A1* | 1/2018 | Lee | H01L 21/823885 |
| 2018/0006118 A1* | 1/2018 | Mallela | H01L 27/088 |
| 2018/0006150 A1* | 1/2018 | Anderson | H01L 29/7827 |
| 2018/0012993 A1* | 1/2018 | Cheng | H01L 29/7827 |
| 2018/0033788 A1* | 2/2018 | Cheng | H01L 27/088 |
| 2018/0047828 A1* | 2/2018 | Gluschenkov | H01L 29/66666 |
| 2018/0053767 A1* | 2/2018 | Cheng | H01L 27/1052 |
| 2018/0053844 A1* | 2/2018 | Bi | H01L 29/7827 |
| 2018/0061845 A1* | 3/2018 | Cheng | H01L 27/11206 |
| 2018/0069131 A1* | 3/2018 | Balakrishnan | H01L 29/78642 |
| 2018/0090388 A1* | 3/2018 | Anderson | H01L 21/823842 |
| 2018/0122800 A1* | 5/2018 | Cheng | H01L 27/088 |
| 2018/0197793 A1* | 7/2018 | Guo | H01L 21/823821 |
| 2018/0211866 A1* | 7/2018 | Cheng | H01L 21/76224 |
| 2018/0212040 A1* | 7/2018 | Bao | H01L 29/78696 |
| 2018/0233502 A1* | 8/2018 | Balakrishnan | H01L 27/092 |
| 2018/0233503 A1* | 8/2018 | Balakrishnan | H01L 27/092 |
| 2018/0240873 A1* | 8/2018 | Cheng | H01L 29/0847 |

FOREIGN PATENT DOCUMENTS

| | | |
|---|---|---|
| TW | I420573 | 12/2013 |
| WO | WO-2005055326 | 6/2005 |
| WO | WO-2005074035 | 8/2005 |
| WO | WO 2008/079077 | 4/2008 |
| WO | WO-2011121776 | 10/2011 |

OTHER PUBLICATIONS

Non-Final Office Action for Taiwan Patent Application No. 104101665 dated Feb. 23, 2016, 3 pgs.

Non-Final Office Action and Search Report for Taiwanese Patent Application No. 105126601 dated Mar. 13, 2017, 6 pgs., with English translation.

European Search Report for EP 14887440.7, dated Oct. 24, 2017, 8 pages.

International Preliminary Report on Patentability for International Patent Application No. PCT/US2014/032204, dated Oct. 13, 2019, 9pgs.

Notice of Allowance from Chinese Patent Application No. 201480076339.8, dated Oct. 30, 2019, 4 pgs.

Office Action from European Patent Application No. 14887440.7, dated May 19, 2020, 6 pages.

Office Action from Korean Patent Application No. 10-2016-7023136, dated Mar. 16, 2020, 8 pages.

* cited by examiner

CROSS-SECTIONAL VIEW                    TOP VIEW

SELECTIVELY REGROWN TOP CONTACT FOR VERTICAL SEMICONDUCTOR DEVICES

CLAIM OF PRIORITY

This patent application is a U.S. National Phase application under 35 U.S.C. § 371 of International Application No. PCT/US2014/032204, filed Mar. 28, 2014, entitled "SELECTIVELY REGROWN TOP CONTACT FOR VERTICAL SEMICONDUCTOR DEVICES," the entire contents of which are incorporated herein by reference.

TECHNICAL FIELD

Embodiments of the invention are in the field of semiconductor devices and, in particular, vertical semiconductor devices having selectively regrown top contacts and method of fabricating vertical semiconductor devices having selectively regrown top contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, or gate-all-around devices, such as nanowires, have become more prevalent as device dimensions continue to scale down. Many different techniques have been attempted to reduce channel or external resistance of such transistors. However, significant improvements are still needed in the area of channel or external resistance suppression.

Additionally, many different techniques have been attempted to manufacture devices with non-Si channel materials such as SiGe, Ge, and III-V materials. However, significant process improvements are still needed to integrate these materials onto Si wafers.

Furthermore, maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example. Many different techniques have been attempted to improve the mobility of transistors. However, significant improvements are still needed in the area of electron and/or hole mobility improvement for semiconductor devices.

BRIEF DESCRIPTION OF THE DRAWINGS

FIG. 2A illustrates a cross-sectional view of a semiconductor structure following drain and vertical channel region formation;

FIG. 2B illustrates a cross-sectional view of the semiconductor structure of FIG. 2A following source region regrowth;

FIG. 2C illustrates a cross-sectional view of the semiconductor structure of FIG. 2B following isolation recess;

FIG. 2D illustrates a cross-sectional view of the semiconductor structure of FIG. 2C following gate stack formation;

FIG. 2E illustrates a cross-sectional view and corresponding plan view of the semiconductor structure of FIG. 2D following gate stack patterning;

FIG. 2F illustrates a cross-sectional view of the semiconductor structure of FIG. 2E following second isolation formation;

FIG. 2G illustrates a cross-sectional view of the semiconductor structure of FIG. 2F following second isolation recess and regrown source exposure;

FIG. 2H illustrates a cross-sectional view of the semiconductor structure of FIG. 2G following source contact formation; and FIG. 2I illustrates a cross-sectional view of the semiconductor structure of FIG. 2H following drain contact and gate contact formation.

DESCRIPTION OF THE EMBODIMENTS

Vertical semiconductor devices having selectively regrown top contacts and method of fabricating vertical semiconductor devices having selectively regrown top contacts are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to regrown source regions for vertical devices, such as for metal oxide semiconductor field effect transistors (MOSFETs). One or more embodiments may be applicable for high performance, low leakage logic complementary metal oxide semiconductor (CMOS) devices. In one embodiment, a selectively regrown top contact (e.g., source region) is implemented in a vertical devices to enable a reduction in extrinsic resistance. Embodiments may be applicable to vertical devices, compound semiconductor (III thru V) devices, MOS\CMOS applications. In one embodiment, a vertical device is defined as one having one source/drain region oriented above another source/drain region, with a channel region running perpendicularly, between the two regions, with respect to an underlying substrate surface.

To provide context, without regrowth, dimensions of a top contact of a thin body, vertical device, are largely determined by the width of body. If the body is aggressively scaled (e.g., to dimensions less than 20 nanometers), the top contact will also be so scaled, yielding a large contact resistance. In order to address such issues, one or more embodiments described herein enabling decoupling of the width of the top contact from the width of the body, potentially providing for a smaller associated contact resistance.

Figure 1A:
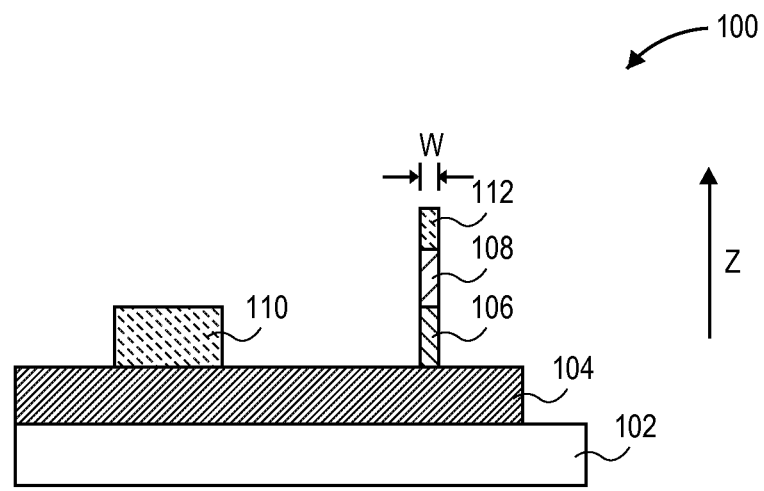
FIG. 1A illustrates a cross-sectional view of a portion of a vertical semiconductor device having an original source region.

To aid with further understanding current issues with state-of-the-art approaches to fabricating a vertical MOS-FET structure, FIG. 1A illustrates a cross-sectional view of a portion of a vertical semiconductor device 100 having an original source region. Referring to FIG. 1A, the vertical semiconductor device 100 is fabricated on or above a substrate 102 and includes a lower drain region 104, a channel region 106, and an upper source region 108 with respect to the orientation (z) of the substrate 102. A drain contact 110 is disposed on the lower drain region 104, and a source contact 112 is disposed on the upper source region 108. It is to be appreciated that a gate electrode typically wraps around the channel region 106, but such a gate electrode is not depicted here for ease of illustration.

With reference again to FIG. 1A, a present issue with the state-of-the-art vertical MOS-FET structure is that the width (w) of the source contact 112 is essentially the same as the horizontal body thickness of the channel region 106. For advanced device technology nodes, such an arrangement could leave such a source contact width (w) less than 10 nanometers. A concern is that such a narrow source contact width (w) can be associated with high contact resistance ($R_C$) for such thin body, vertical devices. State-of-the-art approaches may be so limited since current approaches involve growth of an entire material stack of the device at a single operation, followed by the use of a mask to etch reveal the channel for gate fabrication, rendering a same top contact width dimension as the horizontal body dimension of the channel region.

Figure 1B:
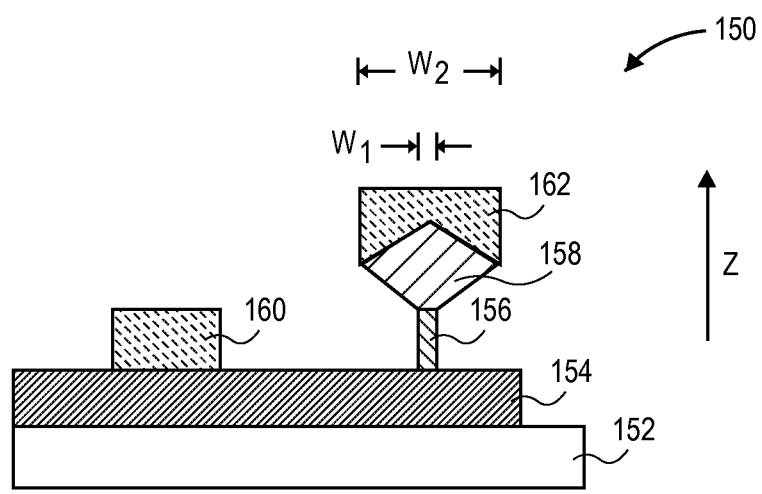
FIG. 1B illustrates a cross-sectional view of a portion of a vertical semiconductor device having a regrown source region, in accordance with an embodiment of the present invention.

By contrast to the device of FIG. 1A, FIG. 1B illustrates a cross-sectional view of a portion of a vertical semiconductor device 150 having a regrown source region, in accordance with an embodiment of the present invention. Referring to FIG. 1B, the vertical semiconductor device 150 is fabricated on or above a substrate 152 and includes a lower drain region 154, a channel region 156, and an upper source region 158 with respect to the orientation (z) of the substrate 152. A drain contact 160 is disposed on the lower drain region 154, and a source contact 162 is disposed on the upper source region 158. It is to be appreciated that a gate electrode typically wraps around the channel region 156, but such a gate electrode is not depicted here for ease of illustration. It is also to be appreciated that the locations of the lower drain region 154 and upper source region 158 may be reversed in some embodiments to provide a lower source region and upper drain region.

Referring again to FIG. 1B, the width (w2) of the source contact 162 is greater than the horizontal body thickness (w1) of the channel region 156. For advanced device technology nodes, in one embodiment, such an arrangement provides for a source contact width (w2) greater than 10 nanometers even though an associated horizontal body thickness (w1) of the channel region 156 is less than 10 nanometers. In an embodiment, such a "regrown source" enables fabrication of a source contact width as decoupled from body thickness of the vertical channel region, allowing for a reduction in $R_C$. In one such embodiment, approaches involve selectively regrowing the top contact (e.g., source region) to decouple the contact width from the channel width. The result can be to reduce the extrinsic resistance associated with that top contact. In an embodiment, a potential secondary effect can be derived in cases where the source is not lattice-matched to the channel, providing for a strain-inducing effect to the channel region. Such a strain-induced channel region may exhibit increased mobility.

Without regrowth, thin body, vertical devices will have small top contact area. By contrast, one or more embodiments described herein enable fabrication of a top contact that is significantly larger than the body. In an exemplary process flow, FIGS. 2A-2I illustrate various operations in a method of fabricating a vertical semiconductor device having a regrown source region, in accordance with an embodiment of the present invention.

Figure 2A:
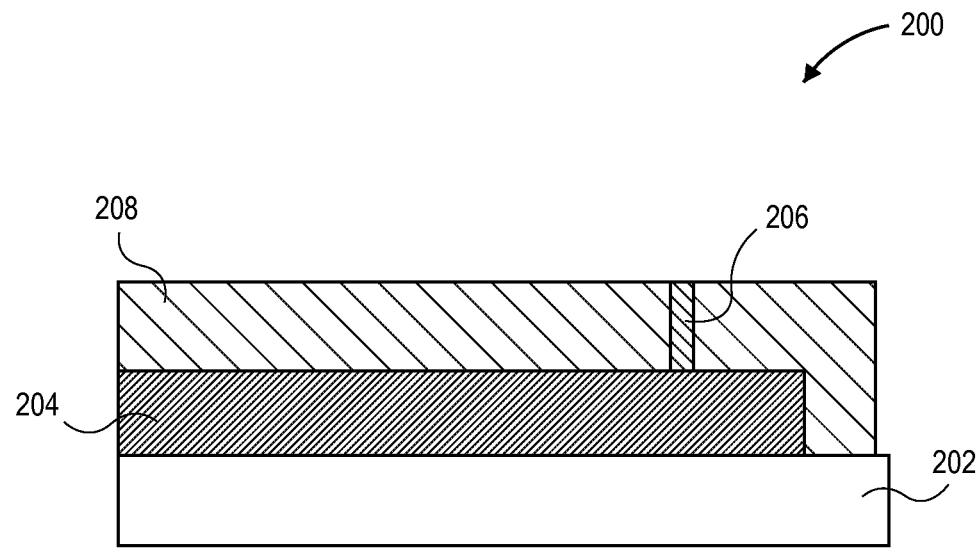
FIGS. 2A-2I illustrate various operations in a method of fabricating a vertical semiconductor device having a regrown source region, in accordance with an embodiment of the present invention, where.

FIG. 2A illustrates a cross-sectional view of a starting point semiconductor structure 200 following drain region 204 and vertical channel region 206 formation above a substrate 202. In an embodiment, the drain region 204 is epitaxially grown above the substrate 202. The vertically grown channel region 206 can either be grown epitaxially on the drain region 204 or can be patterned into a thicker initial drain plus channel region material layer. In either case, in one embodiment, the vertical channel region is patterned using a mask and etch process into a semiconductor layer. Then, as is depicted in FIG. 2A, an isolation layer 208 is formed over the structure and planarized, leaving an uppermost portion of the vertical channel region 206 exposed. The isolation layer 208 may be referred to as a shallow trench isolation (STI) layer since it can ultimately be used to isolate neighboring devices from one another. Such an STI layer may be formed by a deposition and chemical mechanical polishing (CMP) process.

In an embodiment, substrate 202 is composed of a semiconductor material that can withstand a manufacturing process while being compatible with materials deposited or epitaxially grown thereon. In an embodiment, substrate 202 is composed of a bulk crystalline silicon, silicon/germanium or germanium layer and may be doped. In one embodiment, the concentration of silicon atoms in bulk substrate 202 is greater than 97%. In another embodiment, substrate 202 is composed of an epitaxial layer grown atop a distinct crystalline substrate, e.g. a silicon epitaxial layer grown atop a boron-doped bulk silicon mono-crystalline substrate. Substrate 202 may alternatively be composed of a group III-V material. In an embodiment, substrate 202 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In other embodiments, substrate 202 includes an intervening insulating layer, such as in the case of a silicon-on-insulator (SOI) substrate.

In an embodiment, the drain region 204 is formed on substrate 202 by a deposition process such as, but not limited to, chemical vapor deposition (CVD), atomic layer deposition (ALD), or molecular beam epitaxy (MBE). In one embodiment, the drain region 204 is in situ doped with impurity atoms. In one embodiment, the drain region 204 is doped with impurity atoms subsequent to formation. In one embodiment, the drain region 204 is in situ doped with impurity atoms and further doped subsequent to formation. In another embodiment, however, the drain region 204 is only doped, e.g., by implantation, subsequent to formation.

It is to be appreciated that the drain region 204 may be composed of a like or different semiconductor material as that of the semiconductor material of substrate 202. In one embodiment, the drain region 204 is composed of a crystalline silicon, silicon/germanium or germanium layer, which may be doped with a charge carrier, such as but not limited to, phosphorus, arsenic, boron or a combination thereof. In another embodiment, the drain region 204 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof, which may be doped with a charge carrier, such as but not limited to, carbon, silicon, germanium, oxygen, sulfur, selenium or tellurium.

In an embodiment, the vertical channel region 206 is formed on the drain region 202 by a deposition process such as, but not limited to, chemical vapor deposition (CVD), atomic layer deposition (ALD), or molecular beam epitaxy (MBE). It is to be appreciated that the vertical channel region 206 may be composed of a like or different semiconductor material as that of the semiconductor material of the drain region 204. In one embodiment, the vertical channel region 206 is composed of a crystalline silicon, silicon/germanium or germanium layer. In another embodiment, the vertical channel region 206 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, the vertical channel region 206 is doped either in situ or post formation by implantation, or both.

In a particular embodiment, the vertical channel region 206 is composed essentially of silicon, is pure silicon, or is essentially pure silicon. The terms composed essentially of silicon, pure silicon or essentially pure silicon may be used to describe a silicon material composed of a very substantial amount of, if not all, silicon. However, it is to be understood that, practically, 100% pure silicon may be difficult to form in the presence of other material such as silicon germanium and, hence, could include a tiny percentage of Ge or other species. The Ge or other species may be included as an unavoidable impurity or component during deposition of Si or may "contaminate" the Si upon diffusion during post deposition processing. As such, embodiments described herein directed to a Si channel portion may include Si channel portions that contain a relatively small amount, e.g., "impurity" level, non-Si atoms or species, such as Ge. By contrast, regions such as a regrown source region may include a significant amount of germanium, e.g., in the form of a silicon germanium layer.

In an embodiment, the vertical channel region 206 has a shape (from a top view perspective) that is one of a square shape, a rectangular shape, a circular shape, or an oval shape. Other geometries may be suitable as well. In one embodiment, from a top view perspective, the width and length of the vertical channel region 206 are approximately the same (e.g., as in the case for a square shape of circular shape), however, they need not be (as in the case for a rectangular or oval shape).

In an embodiment, the isolation layer 208 is composed of a material suitable to ultimately electrically isolate, or contribute to the isolation of, adjacent devices. For example, in one embodiment, the isolation layer 208 is composed of a dielectric material such as, but not limited to, silicon dioxide, silicon oxy-nitride, silicon nitride, or carbon-doped silicon nitride.

Figure 2B:
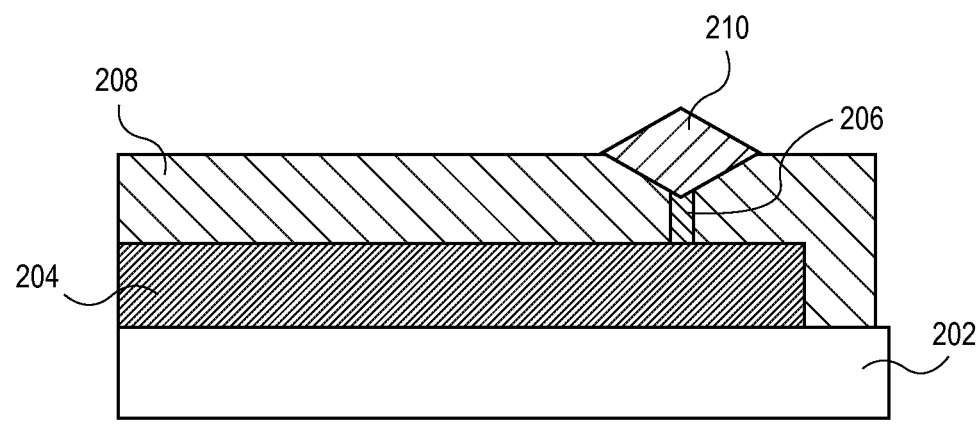

FIG. 2B illustrates a cross-sectional view of the structure of FIG. 2A following source region regrowth. In accordance with an embodiment of the present invention, a source region 210 is formed on the uppermost, exposed surface of the vertical channel region 206. The uppermost surface may be at the height of the portion exposed upon CMP of the STI layer 208. Alternatively, a portion of the vertical channel region 206 is recessed below the surface of the STI layer 208 and the source region 210 is grown on the resulting uppermost surface. In either case, the resulting source region 210 is referred to herein as a regrown source region. In one such embodiment, the source region 210 is formed epitaxially on the uppermost surface of the vertical channel region 206 by a process that leads to faceting of the resulting source region 210. In an embodiment, whether faceted or otherwise, the resulting source region 210 is significantly wider (from the cross-sectional perspective shown) than the horizontal width of the vertical channel region 206, as is depicted in FIG. 2B. Thus, embodiments described herein enable decoupling of the source region 210 width (i.e., the surface area ultimately provided for contact formation) from the horizontal width of the vertical channel region 206. Furthermore, in an embodiment, the epitaxial formation of the source region 210 is selective in that the growth only occurs on the vertical channel region 206 and not on the STI layer 208.

In an embodiment, the source region 210 is formed on vertical channel region 206 by a deposition process such as, but not limited to, chemical vapor deposition (CVD), atomic layer deposition (ALD), or molecular beam epitaxy (MBE). In one embodiment, the source region 210 is in situ doped with impurity atoms. In one embodiment, the source region 210 is doped with impurity atoms subsequent to formation. In another embodiment, however, the source region 210 is only doped, e.g., by implantation, subsequent to formation. In one embodiment, the source region 210 is in situ doped with impurity atoms and further doped subsequent to formation. It is to be appreciated that the source region 210 may be composed of a like or different semiconductor material as that of the vertical channel region 210. In one embodiment, the source region 210 is composed of a crystalline silicon, silicon/germanium or germanium layer, which may be doped with a charge carrier, such as but not limited to, phosphorus, arsenic, boron or a combination thereof. In another embodiment, the source region 210 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof, which may be doped with a charge carrier, such as but not limited to, carbon, silicon, germanium, oxygen, sulfur, selenium or tellurium.

As mentioned briefly above, the source region 210 may be fabricated to impart strain to the vertical channel region 206. In an embodiment, the vertical channel region 206 is a uniaxially strained vertical channel region with the strain along the Z-direction. Such a uniaxially strained vertical channel region 206 may be uniaxially strained with tensile strain or with compressive strain, e.g., for NMOS or PMOS, respectively. In one embodiment, the lattice constant of the source region 210 is smaller than the lattice constant of the vertical channel region 206, and the source region 210 imparts a tensile uniaxial strain to the vertical channel region 206. In another embodiment, the lattice constant of the source region 210 is larger than the lattice constant of the vertical channel region 206, and the source region 210 imparts a compressive uniaxial strain to the vertical channel region 206. In one embodiment, the vertical channel region 206 is composed of $Si_xGe_{1-x}$, and the source region 210 is composed of $Si_yGe_{1-y}$ where $0 \leq x$, $y \leq 1$ and $x \neq y$. In another embodiment, the vertical channel region 206 is composed of $Al_xGa_{1-x}As$, $In_xGa_{1-x}As$, $In_xGa_{1-x}P$ or $Al_xIn_{1-x}Sb$, and the source region 210 is composed of $Al_yGa_{1-y}As$, $In_yGa_{1-y}As$, $In_yGa_{1-y}P$ or $Al_yIn_{1-y}Sb$, respectively, where $0 \leq x$, $y \leq 1$ and $x \neq y$.

Figure 2C:
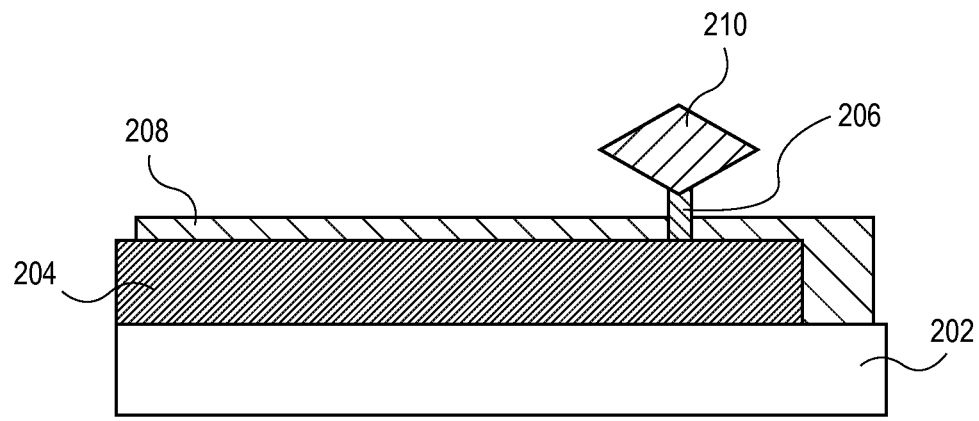

FIG. 2C illustrates a cross-sectional view of the structure of FIG. 2B following isolation recess. In an embodiment, a portion, but not all, of the STI layer 208 is recessed to expose a portion of the vertical channel region 206. The recessing represents initiation of the gate electrode formation process which is elaborated on below, in accordance with FIGS. 2D and 2E. In one embodiment, a wet etch based on aqueous hydrofluoric acid is used to recess the STI layer 208. However, dry etch processing may be used instead of, or in conjunction with, such a wet etch process. In an embodiment, for tunnel FETs, the STI layer is recessed to expose only the junction (e.g., approximately 2-5 nm of the junction); the remainder of the channel region does not necessarily need to be gated. In another embodiment, for MOSFET applications, the recess is performed to the full height of the channel region. However, the recess may be slightly more or less depending on whether or an underlapped gate is to be formed. Accordingly, in one embodiment, for TFET, approximately 10% to 100% of the channel regions is exposed, while for MOSFET, approximately 100% of the channel region is exposed.

Figure 2D:
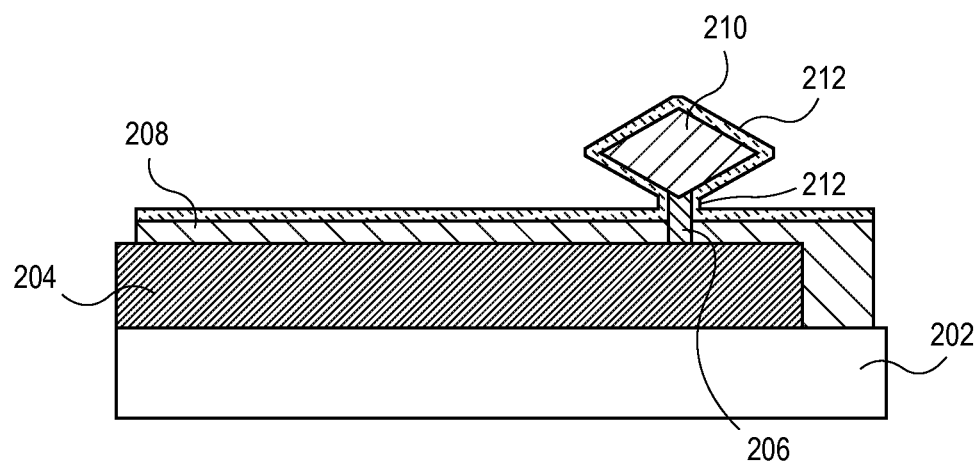

FIG. 2D illustrates a cross-sectional view of the structure of FIG. 2C following gate stack formation. In an embodiment, a gate dielectric layer and gate electrode layer (shown combined as stack 212) is formed on the entire structure of FIG. 2C. Most importantly, the gate stack 212 is formed on all surfaces of the vertical channel region 206 exposed during STI layer 208 recess. Consequentially, in one embodiment, the gate stack 212 is also formed on all exposed surfaces of the source region 210, as is depicted in FIG. 2D. In one embodiment, the layers of the gate stack 212 are formed by atomic layer deposition (ALD) and/or chemical vapor deposition (CVD) and are thus conformal with the structure of FIG. 2C, as is also depicted in FIG. 2D.

In accordance with an embodiment of the present invention, gate stack 212 includes a metal gate electrode and a high-K gate dielectric layer. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the outermost few layers of the vertical channel region 206. In an embodiment, the gate dielectric layer is composed of an outermost high-k portion and an inner portion composed of an oxide of a semiconductor material. In one embodiment, the gate dielectric layer is composed of an outermost portion of hafnium oxide and an inner portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed to surround a metal workfunction-setting layer disposed around the gate dielectric layer.

Figure 2E:
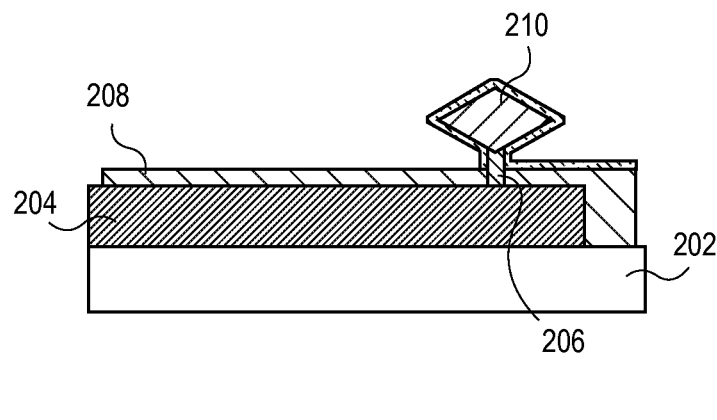
Figure 2E:
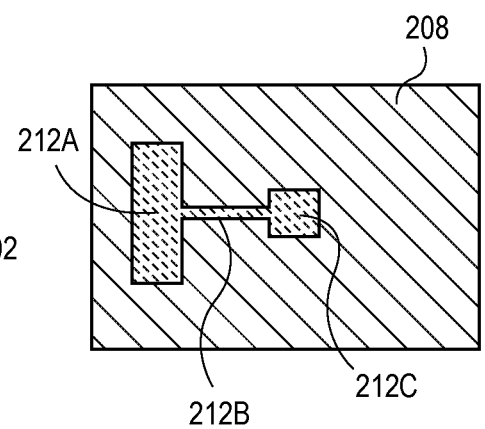

FIG. 2E illustrates a cross-sectional view and corresponding plan view of the structure of FIG. 2D following gate stack 212 patterning. In an embodiment, since the gate stack 212 was formed conformally and without selectivity to different surfaces, the gate stack 212 is patterned, e.g., by a lithography and etch process. In one such embodiment, the gate stack 212 is patterned to leave a portion of the gate stack on the exposed portions of the vertical channel region 206 and the source region 210, and to leave a portion along the surface of the STI layer 208 for ultimate gate contact formation. For example, as seen from the top view, portion 212A of the patterned gate stack 212 is the portion on the source region 210, portion 212C provides a location for later gate contact/via landing, and portion 212B is a line coupling the portions 212A and 212B. In one embodiment, the gate stack 212 is patterned by a dry etch process, wet etch process, or combination thereof, suitable to pattern the layers of the gate stack 212 without significantly impacting the STI layer 208. In an embodiment, subsequent to patterning the gate stack 212, a portion of the gate stack 212 completely surrounds at least a portion of the vertical channel region 206.

Figure 2F:
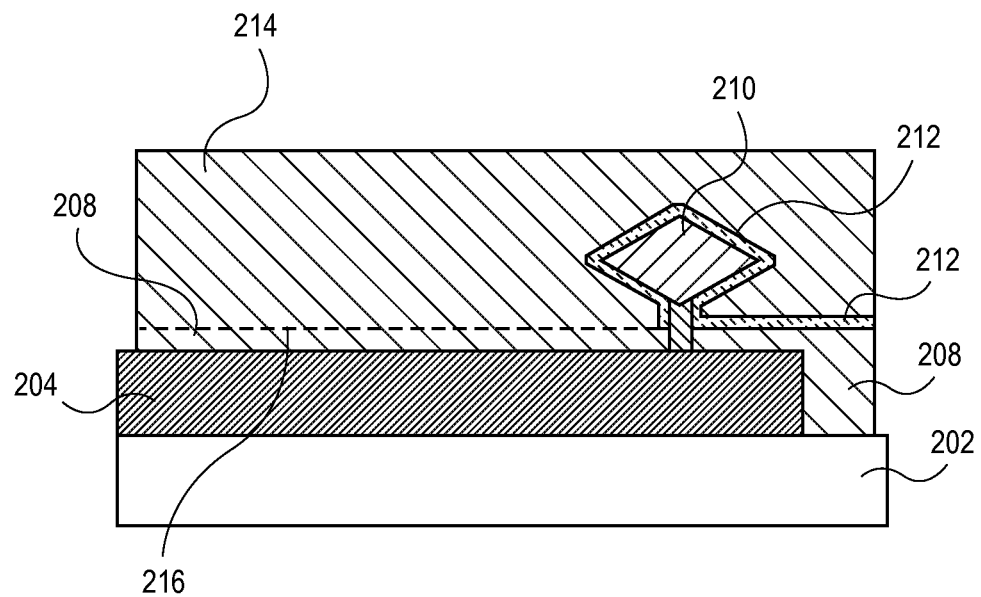

FIG. 2F illustrates a cross-sectional view of the structure of FIG. 2E following second isolation formation. In an embodiment, a second isolation layer 214 is formed to cover the source region 210. In one such embodiment, the second isolation layer is composed of the same material as the STI layer 208, and the layers are essentially indiscernible from one another. However, in other embodiments, a seam 216 is observable between layers 208 and 214, as is depicted, as depicted in FIG. 2F. The second isolation layer may be formed by a deposition process, such as a CVD process, and may be planarized, e.g., by a CMP process. In any case, the second isolation layer can effectively be implemented as a shallow trench isolation structure for isolating devices from one another.

Figure 2G:
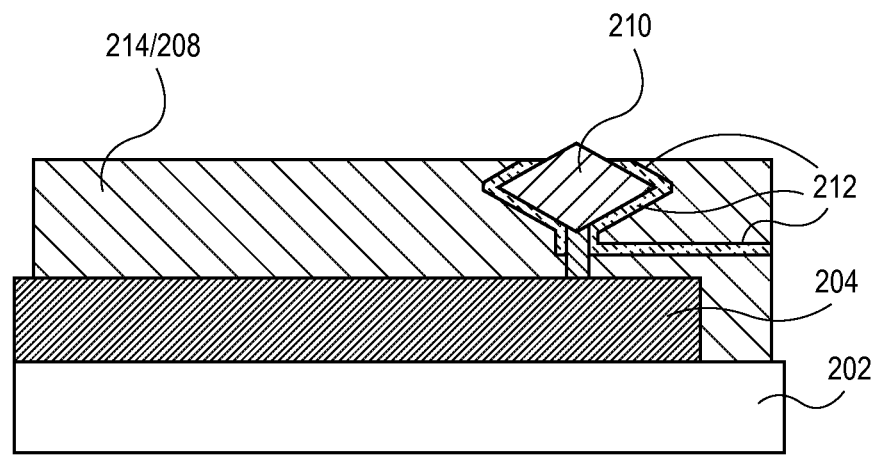

FIG. 2G illustrates a cross-sectional view of the structure of FIG. 2F following second isolation layer 214 recess and source region 210 exposure. In an embodiment, a portion, but not all, of the second isolation layer 214 is recessed to expose a portion of the source region 210. In one embodiment, the second isolation layer 214 is recessed to a level that exposes substantially all of the widest portion of the source region 210 in order to maximize the surface are exposed for later source contact formation. In an embodiment, in addition to recessing the second isolation layer 214, exposed portions of the gate stack 212 are removed from the source region 210. By removing these portions of the gate stack, the surface of the source region 210 that protrudes above the second isolation layer 214 is not protected by gate stack 212 material, as is depicted in FIG. 2G. In one embodiment, a wet etch is used to recess the second isolation layer 214 and to remove the exposed portions of the gate stack 212. However, dry etch processing may be used instead of, or in conjunction with, such a wet etch process.

Figure 2H:
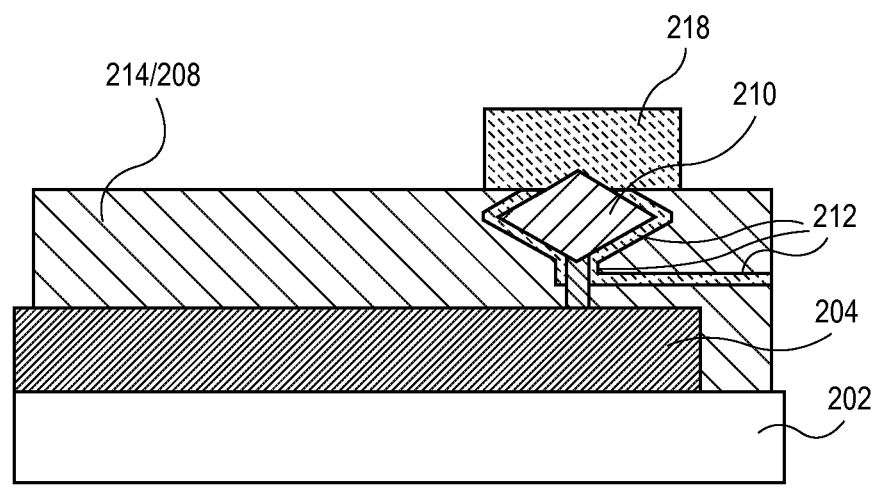

FIG. 2H illustrates a cross-sectional view of the structure of FIG. 2G following source contact formation. In an embodiment, a source contact 218 is formed to cover substantially all of the portion of source region 210 protruding above the second isolation layer 214. In one embodiment, the source contact 218 is formed by a subtractive depiction and etch process. In another embodiment, the material of source contact 218 is formed by selective growth on the portion of source region 210 protruding above the second isolation layer 214.

In an embodiment, source contact 218 is composed of a conductive material. In one such embodiment, source contact 218 is composed of a metal or metallic material. The metal or metallic material may be a pure metal, such as tungsten, nickel, or cobalt, or may be an alloy such as a metal-metal alloy or a metal-semiconductor alloy (e.g., such as a silicide material).

Figure 2I:
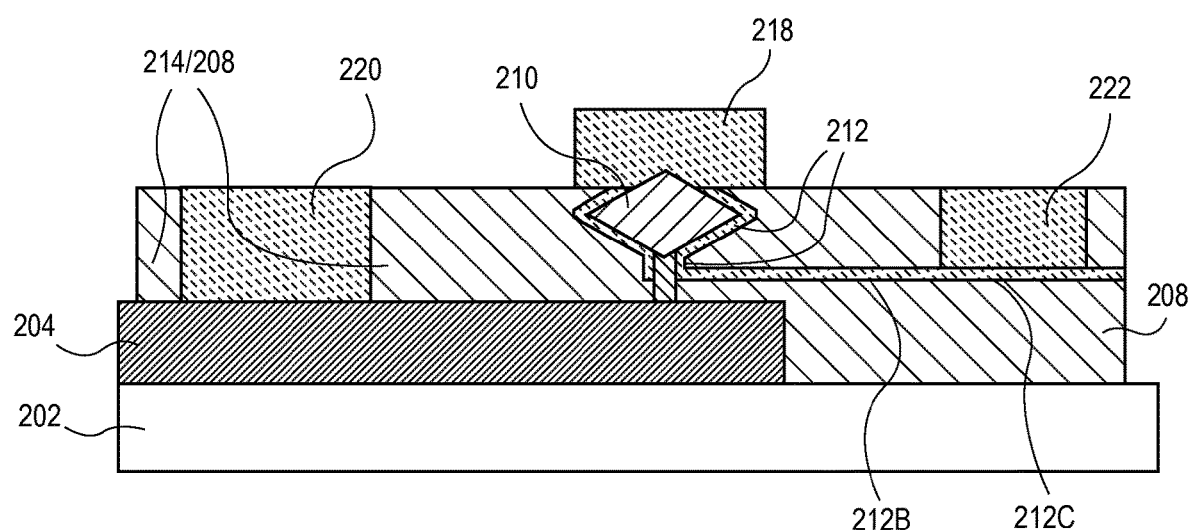

FIG. 2I illustrates a cross-sectional view of the semiconductor structure of FIG. 2H following drain contact and gate contact formation. In an embodiment, the STI structure (including the second isolation layer 214 and the STI layer 208) is patterned with via/contact holes to expose portions of the drain region 204 and the gate stack 212 (e.g., the portion 212C described in association with FIG. 2E). A drain contact 220 and a gate contact 222 may then be fabricated by a metal deposition and planarization process or by a selective growth process. In either case, in one embodiment, the material of the drain contact 220 and the gate contact 222 is substantially the same as the material of the source contact 218. Although, in other embodiments, the material of the drain contact 220 and the gate contact 222 is different from the material of the source contact 218. In an embodiment, the via/contact holes formed to expose portions of the drain region 204 and the gate stack 212 are fabricated using a lithography and etch process.

Referring again to FIG. 2I, a semiconductor device based on a vertical channel region may be a semiconductor device incorporating a gate surrounding the channel region, and a pair of vertically oriented source/drain regions. In an embodiment, the semiconductor device is a MOS-FET. In one embodiment, the semiconductor device is a vertical MOS-FET and is an isolated device or is one device in a plurality of nested devices. It is to be appreciated that the structures resulting from the above exemplary processing scheme, e.g., the structure from FIG. 2I, may be used in a same or similar form for subsequent processing operations to complete device fabrication, such as PMOS and/or NMOS device fabrication. In such cases, opposing source and drain regions have a same conductivity type. As will be appreciated for a typical integrated circuit, both N- and P-channel transistors may be fabricated on a single substrate to form a CMOS integrated circuit. In other embodiments, a tunnel field effect transistor (TFET) is fabricated having opposing source and drain regions of opposite conductivity type. In either case, additional interconnect wiring may be fabricated in order to integrate such devices into an integrated circuit. Furthermore, it is to be appreciated that a single device may include only one, or more than one (e.g., by use of a common gate stack), of a plurality of vertical channel regions fabricated above a substrate.

Referring again to FIGS. 2A-2I, as depicted, the source metal is in contact with the gate metal. However, it is to be appreciated that in other embodiments, the gate is recessed below the widest part of the source in order to give provide isolation between the gate metal and the source metal.

As described above, embodiments herein may be implemented to reduce contact resistance in cases otherwise including a small source region. In one or more embodiments, a solution involves increasing the contact area to decrease the contact resistance of a vertical device, allowing for the device to have high performance. It is to be appreciated that not all aspects of the processes described above need be practiced to fall within the spirit and scope of embodiments of the present invention. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a gate-all-around device. One or more embodiments may be particularly useful for fabricating semiconductor devices at a 10 nanometer (10 nm) or smaller technology node. Embodiments herein may be applicable for improving transistor layout density and for mitigating trends toward increases in contact resistance. It is to be appreciated that the embodiments are not so limited; for example, in an embodiment, channel widths of up to approximately 20 nanometers may benefit from approaches described herein.

Figure 3:
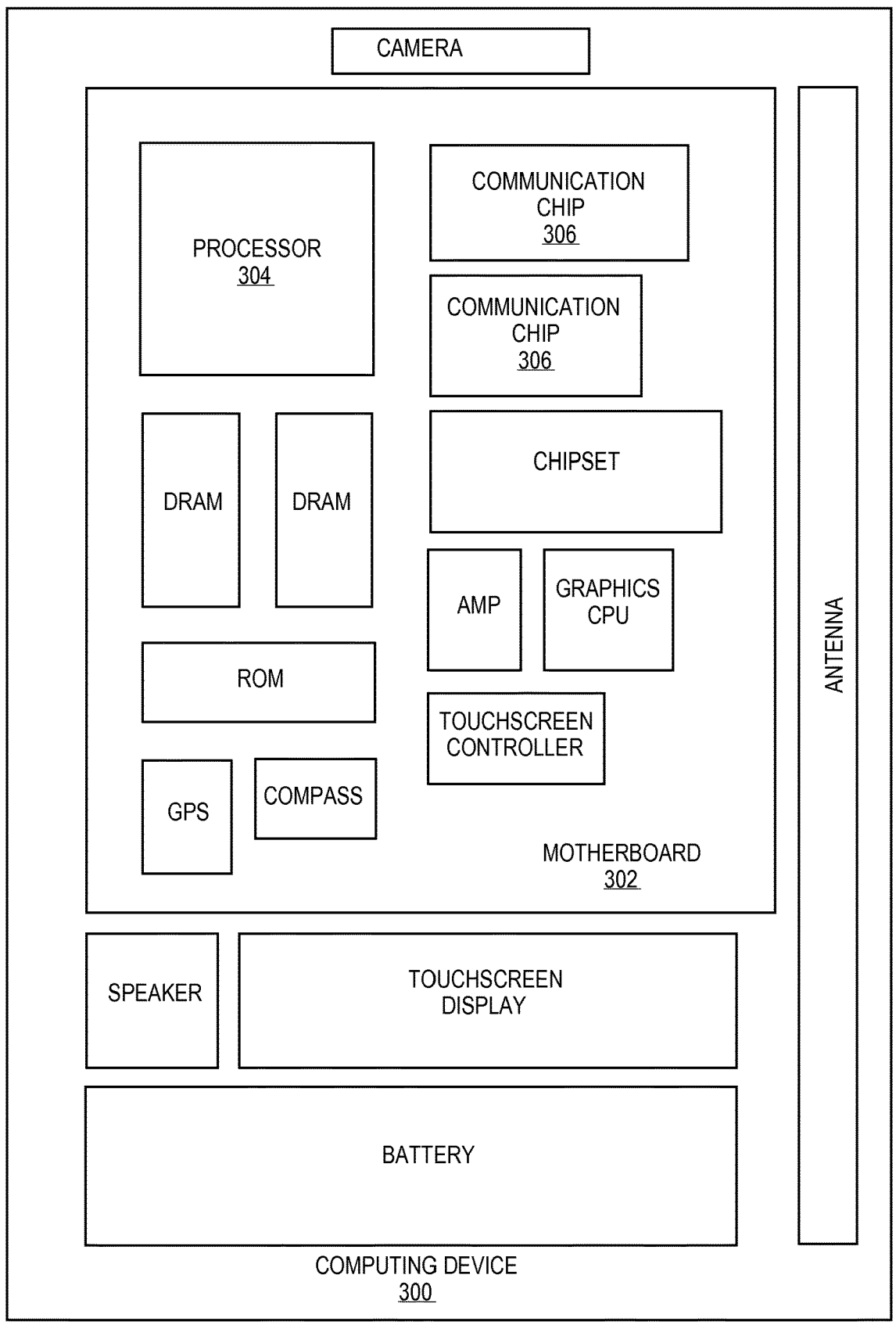
FIG. 3 illustrates a computing device in accordance with one implementation of the invention.

FIG. 3 illustrates a computing device 300 in accordance with one implementation of the invention. The computing device 300 houses a board 602. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as MOS-FET transistors built in accordance with implementations of the invention.

In further implementations, another component housed within the computing device 300 may contain an integrated circuit die that includes one or more devices, such as MOS-FET transistors built in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Thus, embodiments of the present invention include vertical semiconductor devices having selectively regrown top contacts and method of fabricating vertical semiconductor devices having selectively regrown top contacts.

In an embodiment, a semiconductor device includes a substrate having a surface. A first source/drain region is disposed on the surface of the substrate. A vertical channel region is disposed on the first source/drain region and has a first width parallel with the surface of the substrate. A second source/drain region is disposed on the vertical channel region and has a second width parallel with and substantially greater than the first width. A gate stack is disposed on and completely surrounds a portion of the vertical channel region.

In one embodiment, the second source/drain region is a faceted source/drain region.

In one embodiment, the first width is equal to or less than approximately 10 nanometers, and the second width is greater than 10 nanometers.

In one embodiment, the second source/drain region is composed of a semiconductor material different from a semiconductor material of the vertical channel region.

In one embodiment, the semiconductor material of the second source/drain region is lattice mismatched from the semiconductor material of the vertical channel region, and the second source/drain region imparts a strain to the vertical channel region.

In one embodiment, the semiconductor device further includes a first contact disposed on the first source/drain region, a second contact disposed on the second source/drain region, and a gate contact disposed on a horizontal extension of the gate stack.

In one embodiment, the first source/drain region is a drain region, and the second source/drain region is a source region.

In one embodiment, the first source/drain region is a source region, and the second source/drain region is a drain region.

In one embodiment, the gate stack includes a high-k gate dielectric layer and a metal gate electrode.

In one embodiment, a conductivity type of the first source/drain region is the same as a conductivity type of the second source/drain region, and the semiconductor device is a MOS-FET device.

In one embodiment, a conductivity type of the first source/drain region is opposite to a conductivity type of the second source/drain region, and the semiconductor device is a tunnel FET device.

In an embodiment, a semiconductor device includes a substrate having a surface. A first source/drain region is disposed on the surface of the substrate. A vertical channel region is disposed on the first source/drain region and is composed of a semiconductor material. A second source/drain region is disposed on the vertical channel region. The second source/drain region is composed of a semiconductor material different from and lattice mismatched with the semiconductor material of the vertical channel region. A gate stack is disposed on and completely surrounds a portion of the vertical channel region.

In one embodiment, the second source/drain region is a faceted source/drain region.

In one embodiment, the second source/drain region imparts a strain to the vertical channel region.

In one embodiment, the semiconductor device further includes a first contact disposed on the first source/drain region. A second contact is disposed on the second source/drain region. A gate contact is disposed on a horizontal extension of the gate stack.

In one embodiment, the first source/drain region is a drain region, and the second source/drain region is a source region.

In one embodiment, the first source/drain region is a source region, and the second source/drain region is a drain region.

In one embodiment, the gate stack includes a high-k gate dielectric layer and a metal gate electrode.

In one embodiment, a conductivity type of the first source/drain region is the same as a conductivity type of the second source/drain region, and the semiconductor device is a MOS-FET device.

In one embodiment, a conductivity type of the first source/drain region is opposite to a conductivity type of the second source/drain region, and the semiconductor device is a tunnel FET device.

In an embodiment, a method of fabricating a semiconductor device involves forming a first source/drain region on the surface of a substrate. The method also involves forming, from a first semiconductor material, a vertical channel region on the first source/drain region and having a first width parallel with the surface of the substrate. The method also involves forming, from a second semiconductor material, a second source/drain region on the vertical channel region and having a second width parallel with and substantially greater than the first width. The method also involves forming a gate stack on and completely surrounding a portion of the vertical channel region.

In one embodiment, forming the second source/drain region on the vertical channel region involves epitaxially growing the second semiconductor material on the first semiconductor material.

In one embodiment, epitaxially growing the second semiconductor material on the first semiconductor material involves epitaxially growing the second semiconductor material lattice mismatched with the first semiconductor material.

In one embodiment, forming the first source/drain region involves forming a drain region, and forming the second source/drain region involves forming a source region.

In one embodiment, forming the first source/drain region involves forming a source region, and forming the second source/drain region involves forming a drain region.

What is claimed is:

1. A semiconductor device, comprising:
   a substrate having a surface;
   a first source/drain region disposed on the surface of the substrate;
   a first contact disposed on the first source/drain region, the first contact having a top surface;
   a vertical channel region disposed on the first source/drain region and having a first width parallel with the surface of the substrate, and the vertical channel region having an upper portion and a lower portion;
   a second source/drain region disposed on the vertical channel region and having a second width parallel with and substantially greater than the first width, wherein the second source/drain region is faceted with vertices located at a widest portion of the second source/drain region;
   a second contact disposed on the second source/drain region, the second contact having a top surface above the top surface of the first contact; and
   a gate stack comprising a gate dielectric and a gate electrode, the gate stack disposed on and completely surrounding the upper portion but not the lower portion of the vertical channel region, the gate dielectric of the gate stack further laterally surrounding a portion of the second source/drain region having a lateral width greater than a lateral width of the vertical channel region, wherein the second source/drain region extends above the gate stack.

2. The semiconductor device of claim 1, wherein the first width is equal to or less than approximately 10 nanometers, and the second width is greater than 10 nanometers.

3. The semiconductor device of claim 1, wherein the second source/drain region comprises a semiconductor material different from a semiconductor material of the vertical channel region.

4. The semiconductor device of claim 3, wherein the semiconductor material of the second source/drain region is lattice mismatched from the semiconductor material of the vertical channel region, and wherein the second source/drain region imparts a strain to the vertical channel region.

5. The semiconductor device of claim 1, further comprising:
   a gate contact disposed on a horizontal extension of the gate stack.

6. The semiconductor device of claim 1, wherein the first source/drain region is a drain region, and wherein the second source/drain region is a source region.

7. The semiconductor device of claim 1, wherein the first source/drain region is a source region, and wherein the second source/drain region is a drain region.

8. The semiconductor device of claim 1, wherein the gate stack comprises a high-k gate dielectric layer and a metal gate electrode.

9. The semiconductor device of claim 1, wherein a conductivity type of the first source/drain region is the same as a conductivity type of the second source/drain region, and wherein the semiconductor device is a MOS-FET device.

10. The semiconductor device of claim 1, wherein a conductivity type of the first source/drain region is opposite to a conductivity type of the second source/drain region, and wherein the semiconductor device is a tunnel FET device.

11. A semiconductor device, comprising:
    a substrate having a surface;
    a first source/drain region disposed on the surface of the substrate;
    a first contact disposed on the first source/drain region, the first contact having a top surface;
    a vertical channel region disposed on the first source/drain region and comprising a semiconductor material, and the vertical channel region having an upper portion and a lower portion;
    a second source/drain region disposed on the vertical channel region, wherein the second source/drain region comprises a semiconductor material different from and lattice mismatched with the semiconductor material of the vertical channel region, wherein the second source/drain region is faceted with vertices located at a widest portion of the second source/drain region;
    a second contact disposed on the second source/drain region, the second contact having a top surface above the top surface of the first contact; and
    a gate stack comprising a gate dielectric and a gate electrode, the gate stack disposed on and completely surrounding the upper portion but not the lower portion of the vertical channel region, the gate dielectric of the gate stack further laterally surrounding a portion of the second source/drain region having a lateral width greater than a lateral width of the vertical channel region, wherein the second source/drain region extends above the gate stack.

12. The semiconductor device of claim 11, wherein the second source/drain region imparts a strain to the vertical channel region.

13. The semiconductor device of claim 11, further comprising:
    a gate contact disposed on a horizontal extension of the gate stack.

14. The semiconductor device of claim 11, wherein the first source/drain region is a drain region, and wherein the second source/drain region is a source region.

15. The semiconductor device of claim 11, wherein the first source/drain region is a source region, and wherein the second source/drain region is a drain region.

16. The semiconductor device of claim 11, wherein the gate stack comprises a high-k gate dielectric layer and a metal gate electrode.

17. The semiconductor device of claim 11, wherein a conductivity type of the first source/drain region is the same as a conductivity type of the second source/drain region, and wherein the semiconductor device is a MOS-FET device.

18. The semiconductor device of claim 11, wherein a conductivity type of the first source/drain region is opposite to a conductivity type of the second source/drain region, and wherein the semiconductor device is a tunnel FET device.

19. A method of fabricating a semiconductor device, the method comprising:
    forming a first source/drain region on the surface of a substrate;
    forming, from a first semiconductor material, a vertical channel region on the first source/drain region and having a first width parallel with the surface of the substrate, and the vertical channel region having an upper portion and a lower portion;
    forming, from a second semiconductor material, a second source/drain region on the vertical channel region and having a second width parallel with and substantially greater than the first width, wherein the second source/drain region is faceted with vertices located at a widest portion of the second source/drain region;

forming a gate stack comprising a gate dielectric and a gate electrode, the gate stack on and completely surrounding the upper portion but not the lower portion of the vertical channel region, the gate dielectric of the gate stack further laterally surrounding a portion of the second source/drain region having a lateral width greater than a lateral width of the vertical channel region, wherein the second source/drain region extends above the gate stack, forming a first contact on the first source/drain region, the first contact having a top surface; and forming a second contact on the second source/drain region, the second contact having a top surface above the top surface of the first contact.

20. The method of claim 19, wherein forming the second source/drain region on the vertical channel region comprises epitaxially growing the second semiconductor material on the first semiconductor material.

21. The method of claim 20, wherein epitaxially growing the second semiconductor material on the first semiconductor material comprises epitaxially growing the second semiconductor material lattice mismatched with the first semiconductor material.

22. The method of claim 19, wherein forming the first source/drain region comprises forming a drain region, and wherein forming the second source/drain region comprises forming a source region.

23. The method of claim 19, wherein forming the first source/drain region comprises forming a source region, and wherein forming the second source/drain region comprises forming a drain region.

* * * * *